United States Patent
Byers et al.

(10) Patent No.: US 7,688,593 B2
(45) Date of Patent: Mar. 30, 2010

(54) SERVO DAMPER CONTROL OF AIRFLOW WITHIN AN ELECTRONICS CHASSIS

(75) Inventors: Charles C. Byers, Wheaton, IL (US); Christian Joncourt, Lannion (FR); Benoit Morin, Trelevern (FR)

(73) Assignee: Alcatel-Lucent USA Inc., Murray Hill, NJ (US)

(*) Notice: Subject to any disclaimer, the term of this patent is extended or adjusted under 35 U.S.C. 154(b) by 58 days.

(21) Appl. No.: 11/872,153

(22) Filed: Oct. 15, 2007

(65) Prior Publication Data

US 2009/0097203 A1   Apr. 16, 2009

(51) Int. Cl.
*H05K 7/20* (2006.01)
(52) U.S. Cl. ........... 361/721; 361/695; 361/719; 165/80.2; 165/104.33; 165/122; 174/16.1; 454/184
(58) Field of Classification Search .......... 361/695, 361/721; 174/16.1; 165/80.2, 104.33, 122; 454/184
See application file for complete search history.

(56) References Cited

U.S. PATENT DOCUMENTS

| | | | |
|---|---|---|---|
| 6,694,759 B1 * | 2/2004 | Bash et al. | 62/180 |
| 6,957,544 B2 * | 10/2005 | Dobbs et al. | 62/178 |
| 6,981,915 B2 * | 1/2006 | Moore et al. | 454/184 |
| 6,991,533 B2 * | 1/2006 | Tsai et al. | 454/184 |
| 7,133,287 B2 | 11/2006 | Campini et al. | |
| 7,316,606 B2 * | 1/2008 | Shipley et al. | 454/184 |
| 7,344,439 B2 * | 3/2008 | Henry et al. | 454/184 |
| 7,420,806 B1 * | 9/2008 | Lima et al. | 361/695 |
| 7,508,663 B2 * | 3/2009 | Coglitore | 361/695 |
| 2005/0168942 A1 * | 8/2005 | Steinbrecher | 361/690 |
| 2008/0304229 A1 * | 12/2008 | June et al. | 361/687 |

* cited by examiner

*Primary Examiner*—Boris L Chervinsky
(74) *Attorney, Agent, or Firm*—Hitt Gaines, PC

(57) ABSTRACT

Provided is an apparatus and a system. The apparatus, in one embodiment, includes a chassis having one or more slots configured to hold circuit boards and a plenum coupled to the chassis. The apparatus, in this embodiment, further includes a fan assembly coupled to the plenum and configured to provide an airflow therethrough, and servo dampers associated with the one or more slots and configured to allocate a portion of the airflow to associated air paths.

12 Claims, 5 Drawing Sheets

TOP VIEW

FRONT VIEW

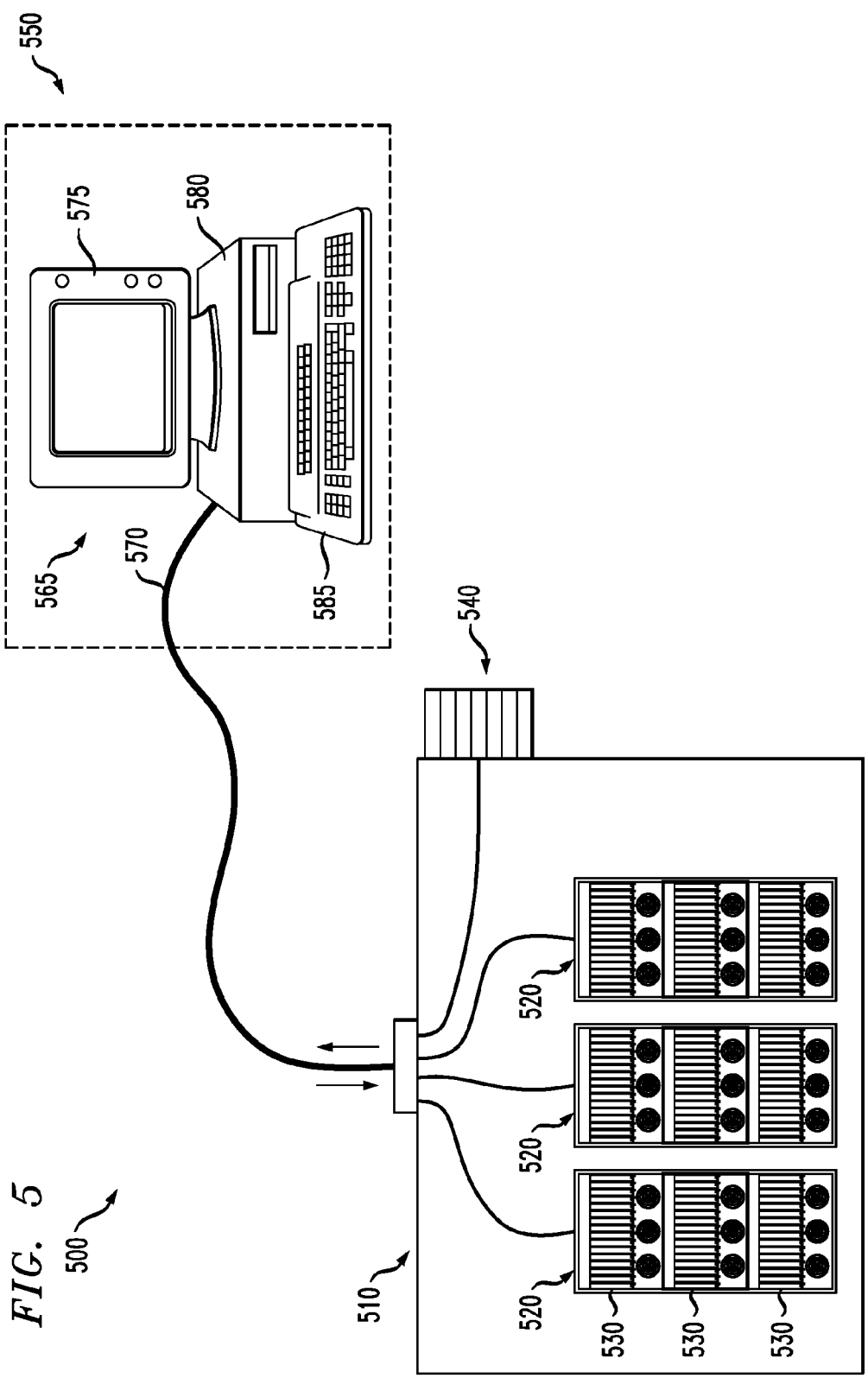

SERVO DAMPER CONTROL OF AIRFLOW WITHIN AN ELECTRONICS CHASSIS

TECHNICAL FIELD

The present disclosure is directed, in general, to heat dissipation and, more specifically, to the heat dissipation of circuit boards in modular electronic systems.

BACKGROUND

Various industry efforts have been directed to defining a standardized, modular telecommunications equipment solution. A leading standard resulting from one of these endeavors is the Advanced Telecommunications Architecture (also referred to as AdvancedTCA). The AdvancedTCA standard defines an open switch fabric based platform delivering an industry standard high performance, fault tolerant, and scalable solution for next generation telecommunications and data center equipment. The development of the AdvancedTCA standard is being carried out within the PCI Industrial Computer Manufacturers Group (PICMG)—the same group that created the highly successful Compact PCI standard. The Advanced TCA base specification defines the physical and electrical characteristics of an off-the-shelf, modular chassis based on switch fabric connections between hot-swappable circuit boards (e.g., blades). The Advanced TCA base specification supports multiple fabric connections, including the Ethernet, InfiniBand, PCI Express, and RapidIO.

The AdvancedTCA base specification defines the chassis (e.g., shelf) and board form factors, core backplane fabric connectivity, power, cooling, management interfaces, and the electromechanical specification of the AdvancedTCA-compliant boards. The AdvancedTCA base specification also defines a power budget of 200-400 Watts (W) per board, enabling high performance servers with multi-processor architectures and multi gigabytes of on-board memory, Digital Signal Processor pools, Packet processors, and storage arrays.

The PICMG organization has performed extensive thermal modeling in order to design the AdvancedTCA board and chassis form factors to support up to 200 W power dissipation per board slot. Other form factors (for example MicroTCA) have different cooling limits per module. In a typical implementation, the chassis uses conventional air cooling, with blowers pulling air from front-bottom to top-rear. Mechanical fans are typically the element with the lowest MTBF (mean time between failure), and thus thermal designs incorporate sufficient overhead to accommodate a failed blower. In view of the rigid board and chassis form factors defined by the AdvancedTCA base specification, problems in achieving sufficient cooling for certain specific high-power components (e.g., processors) exist—since the majority of the cooling capability will be consumed by such specific components, as opposed to equally across all of the components in the chassis.

Accordingly, what is needed in the art is an apparatus or system configured to dissipate greater amounts of heat per board in a given chassis (e.g., an AdvancedTCA chassis).

SUMMARY

To address the above-discussed deficiencies, provided is an apparatus, a system, and a method for operating a system. The apparatus, in one embodiment, includes a chassis having one or more slots configured to hold circuit boards, and a plenum coupled to the chassis. The apparatus, in this embodiment, further includes a fan assembly coupled to the plenum and configured to provide an airflow therethrough, and servo dampers associated with the one or more slots and configured to allocate a portion of the airflow to associated air paths.

The system, in one embodiment, includes an installation site including a rack having two or more stacked apparatuses, each apparatus having the elements discussed in the paragraph above. The system, in this embodiment, further includes one or more control subsystems in electrical communication with the two or more stacked apparatuses and configured to control the servo dampers of each apparatus to allocate a portion of the airflow of each fan assembly to each of the associated air paths of each apparatus.

The method for operating the system, in one embodiment, includes providing an apparatus as discussed in the paragraphs above. The method additionally includes activating the fan assembly to provide an airflow into the plenum, and adjusting positions of the servo dampers to allocate the airflow among air paths associated with the slots, wherein the adjusting is based upon at least one of temperature data or airflow data obtained from the apparatus.

BRIEF DESCRIPTION OF THE DRAWINGS

For a more complete understanding of the present disclosure, reference is now made to the following descriptions taken in conjunction with the accompanying drawings, in which:

FIG. 5 illustrates a system manufactured in accordance with the disclosure.

DETAILED DESCRIPTION

Figure 1:
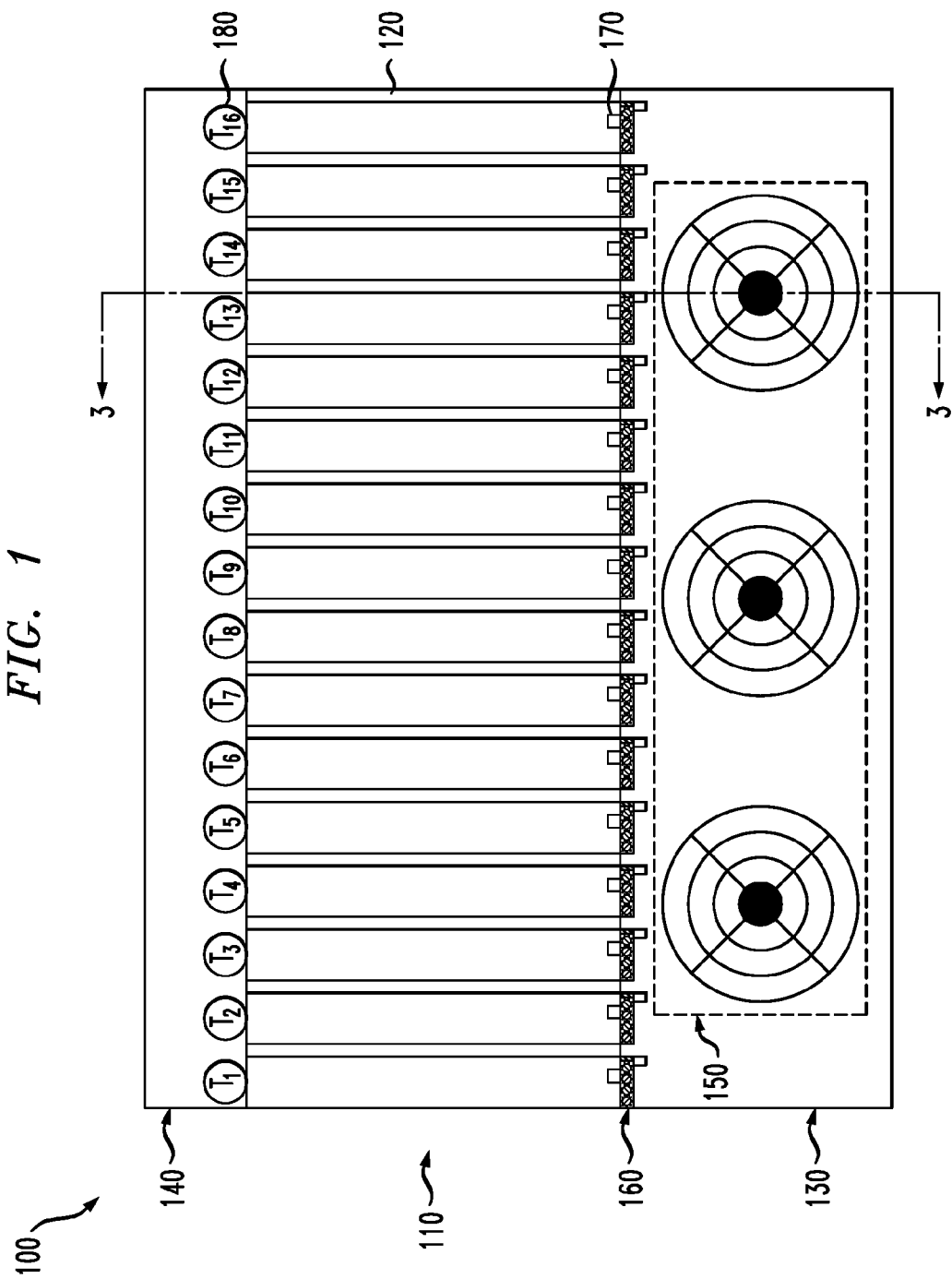
FIG. 1 illustrates an apparatus manufactured in accordance with the disclosure.

Currently, modular electronic systems (such as AdvancedTCA) use large volumes of cooling air to cool various circuit boards and other modules. This air is often not efficiently used when divided among the various air paths it must flow through to cool the circuits. In some cases, too much air flows through an air path that offers a small resistance (or restriction) to the airflow, and the cooling capacity is wasted. In other cases, where the air paths are more restricted (perhaps because of dense heat sinks, tall components, etc.), inadequate air passes through the air path, and the circuitry overheats. It is difficult in complex system designs to balance the path resistances, pressures, flow rates, and cooling capacity between the various air paths that may exist.

To counteract the aforementioned problems, cooling systems often provide a large excess of cooling capacity to insure that the most restrictive or demanding air path has adequate cooling flow. This requires large fans, moving extra air through paths that don't need such large airflow. Not only are these cooling systems physically large (e.g., consuming precious frame space), but the large fans draw a significant amount of energy, adding to the cost of operating the system. Additionally, fans rotating faster have higher acoustic noise emissions, causing difficulties with conforming to regulatory requirements (e.g., OSHA specifications). Moreover, if fans must run faster because of inefficient use of the available cooling air, they tend to fail sooner.

To counteract the aforementioned problems, cooling systems additionally compensate for the cooling imbalances through the use of restrictor plates that artificially impede certain air paths in an attempt to direct the available airflow to paths where it is needed. These restrictor plates are difficult to configure, and all restrictor plates in a shelf potentially require modification when the configuration of a single slot within it changes. To provide adequate granularity of airflow control, several different types of restrictor plates (e.g., with different percentages of open area) must be stocked for each slot. Because this approach is manual, it cannot easily and quickly respond to highly dynamic events (like a fan failure, abnormal environmental condition, etc.).

In view of the foregoing, the present disclosure recognizes that small servo-mechanism controlled air dampers may be installed within one or more air paths to be managed. The servo dampers, therefore, allocate (e.g., dynamically) a portion of the airflow created by the fan assembly to associated air paths. In one example embodiment, if temperature sensors (e.g., mounted in major chips like microprocessors, or in exhaust streams) sense that the components in that path are running hot, an actuator causes a damper to open by a predictable, controlled amount, allowing more air through that specific air path. Similarly, if a component is running cool enough, but other air paths are demanding more air, the corresponding damper may be commanded to slightly close that air path, which causes more air to flow through the alternative air paths where it is needed. Additionally, the airflow generated by the fan assembly may be adjusted to the appropriate level (e.g., by throttling the fan up or down to provide the needed amount of airflow) after the dampers find their optimal position. Accordingly, the servo dampers may cause the air paths in the system to each have exactly enough restriction (e.g., not too much or too little) to permit balanced cooling over the entire system.

In accordance with this disclosure, the one or more servo dampers, as well as the output of the fan assembly, may be adjusted either manually or automatically (e.g., through the use of manual or automatically generated control commands provided to the servo dampers or fan assembly), depending on the application. For instance, in one example embodiment the servo dampers may react automatically to rebalance the airflow across the system, without human intervention, if the system's configuration changes (e.g., because a cooling fan fails, different boards or mezzanines are installed, one or more circuit boards are running at elevated temperatures, etc.). In an alternative embodiment, human intervention (e.g., manual intervention via an element management computer) is required to open and close each of the servo dampers of the system. Nevertheless, whether the modifications to the servo dampers occur with or without human intervention, the servo dampers may be quickly and easily adjusted to accommodate the needs of the individual components of the system, as well as the system as a whole.

Turning to FIG. 1, illustrated is an apparatus 100 manufactured in accordance with the disclosure. The apparatus 100 includes a chassis 110 (e.g., shelf). The chassis 110 may be any chassis including one or more slots configured to hold one or more circuit boards (e.g., an electronic subassembly typically comprised of a printed wiring board with electrical or mechanical mounted components and backplane connections), including a chassis designed and manufactured in accordance with the AdvancedTCA standard. The term slot, as used in this disclosure, should not be limited to any specific physical structure, as a slot may be any location within the chassis 110 configured to hold a circuit board 120. In one example embodiment, each circuit board 120 is positioned within a slot, each circuit board 120 mating with a backplane of the chassis 110, and being fixed within that specific slot using one or more fasteners on the front or back side of the chassis 110. In an alternative embodiment, the chassis 110 includes one or more rails configured to precisely position each circuit board 120 within each slot. This embodiment may additionally use the one or more fasteners to fix the circuit boards 120 within the one or more slots. Other embodiments for positioning the circuit boards 120 within the slots also exist.

The number of slots for each chassis 110 may vary based upon the specific application. For instance, in the embodiment of FIG. 1 the chassis 110 includes 16 slots configured to hold 16 circuit boards 120. This disclosed embodiment is one configuration that complies with the aforementioned AdvancedTCA standard, however, others may exist.

The apparatus 100 of FIG. 1 further includes a first plenum 130 and a second plenum 140 coupled to the chassis 110. In accordance with the disclosure, a fan assembly 150 is coupled (e.g., removably coupled) to at least one of the first plenum 130 or the second plenum 140. In the example embodiment of FIG. 1, the fan assembly 150 is coupled to the first plenum 130. Accordingly, in this embodiment the fan assembly 150 is pushing airflow that it obtains from the environment surrounding the apparatus 100 through the first plenum 130, thereby pressurizing it, across the circuit boards 120 located within the one or more slots, and into the second plenum 140, wherein the airflow exits the apparatus 100 into the environment. In this disclosed embodiment, the airflow enters the first plenum 130 on a front side of the apparatus 100 and exits the second plenum 140 on a back side of the apparatus 100.

In an alternative embodiment (not shown), the fan assembly 150 is coupled to the second plenum 140, thereby evacuating it. In this example embodiment, the fan assembly 150 would pull airflow from the environment into the first plenum 130 (e.g., on a front side of the apparatus), across the circuit boards 120 located within the one or more slots, and then into the second plenum 140, wherein the airflow would again exit into the environment (e.g., on the back side of the apparatus).

In yet another embodiment (also not shown), a first fan assembly would be coupled to the first plenum 130 and configured to push airflow over the one or more circuit boards 120 while a second fan assembly would be coupled to the second plenum 130 and configured to pull airflow over the one or more circuit boards 120. This type of system is often referred to as a push/pull type cooling system. Based upon the foregoing, the specific location and number of fan assemblies may vary. Moreover, in those embodiments wherein only a single fan assembly is coupled to a single plenum, the plenum on the opposing side of the chassis 110 is optional, and thus not required.

The fan assembly 150, in accordance with the disclosure, includes any device configured to move air. In the example embodiment of FIG. 1, the fan assembly 150 includes three axial fans. Therefore, in the embodiment of FIG. 1 the number of individual fans comprising the fan assembly 150 is less than the number of slots in the chassis 110. Accordingly, there is not a one to one correlation between the number of individual fans and the number of slots in the chassis in the embodiment of FIG. 1. The fan assembly 150 might also include one or more cross flow fans or centrifugal fans (each of which are configured to move air), as opposed to axial fans. Additionally, the fan assembly 150 may be a modular fan assembly. For example, the fan assembly 150 might include a plurality of hot swappable individual fan units configured in a modular manner.

The apparatus 100 additionally includes servo dampers 160 associated with the one or more slots and configured to allocate a portion of the airflow generated by the fan assembly 150 to one or more associated air paths. The term servo damper, as used herein, means an electronic control system in which an electromechanical, hydraulic, pneumatic, piezoelectric, or other type of controlling mechanism is actuated and controlled by a signal (e.g., low voltage) to open or close an airflow damper. Servo dampers are often controlled using a feedback loop, wherein the movement of the servo dampers is based upon information provided using one or more sensors (e.g., a temperature sensor, airflow (velocity) sensor, etc.). In the disclosed embodiment of FIG. 1, at least one servo damper 160 is associated with each of the 16 circuit boards 120.

Figure 2:
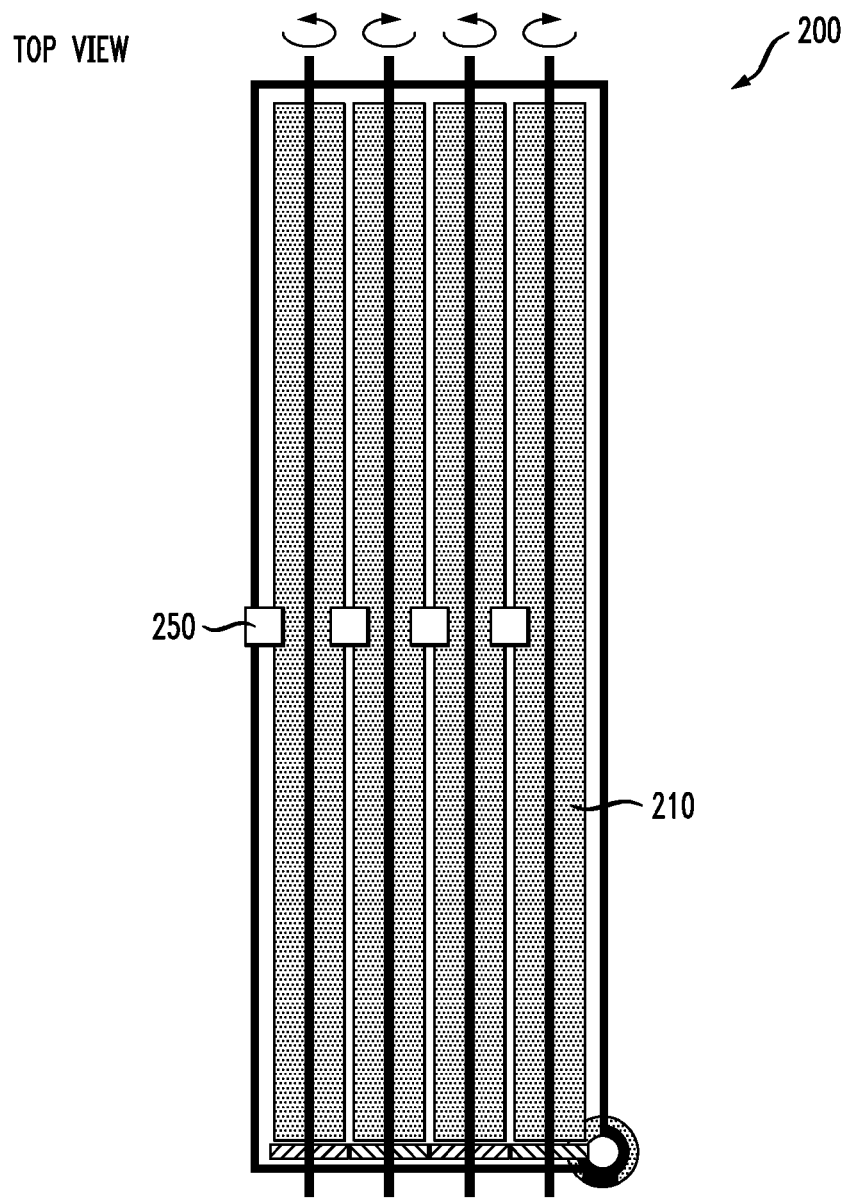
FIG. 2 illustrates an example embodiment of a servo damper that might be used in the apparatus of FIG. 1.
Figure 2:
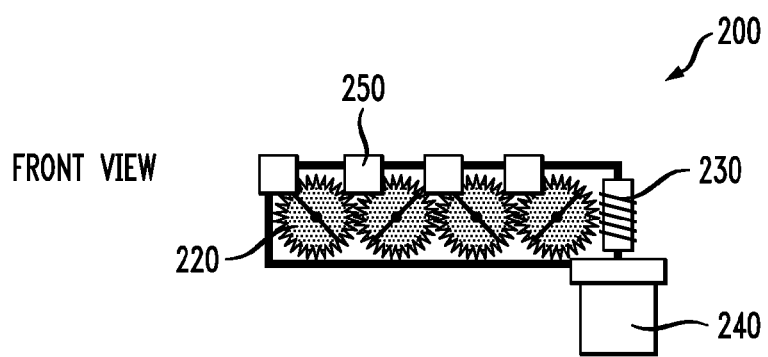

Turning briefly to FIG. 2, illustrated is one example embodiment of a servo damper 200 that might be used in the apparatus 100. The servo damper 200, as shown in the top view and the front view, includes one or more rotating airflow control veins 210. In this embodiment, each of the control veins 210 is coupled to an associated gear 220. The set of gears 220, forming a gear train in this embodiment, is then coupled to a worm gear 230. The worm gear 230 is in turn coupled to a miniature motor 240 (e.g., an electric motor).

The servo damper 200 may additionally include one or more air sensors 250 for measuring a velocity and/or temperature of the airflow passing through the veins 210. In certain embodiment one air sensor 250 per servo damper 200 is adequate, whereas in other embodiments one air sensor 250 per airflow control vein 210 might be used. The information obtained from the one or more air sensors 250 may be used to monitor the correct functioning of the mechanism (e.g., the ability to detect a servo damper which is not working as expected, ability to detect if an air filter is clogged, etc.).

A servo damper, such as the servo damper 200, may be operated by changing the positioning of the control veins 210. For example, when the control veins 210 are positioned perpendicular to the airflow direction, the airflow is largely blocked. However, when the control veins 210 are positioned parallel to the airflow direction, the airflow is maximized. Therefore, the control veins 210 may be positioned perpendicular to the airflow direction, parallel with the airflow direction, or any positioned therebetween, to allow precise control of airflow.

In accordance with one embodiment, position feedback (e.g., from the motor, from the control veins 210, or from the air sensors 250) may be used to choose a specific control vein 210 position. In one example embodiment the servo dampers are designed such that one rotation of the worm gear 230 would equate to a given degree of movement for each control vein 210. For instance, one rotation of the worm gear 230 might equate to 1 degree of rotation for each control vein 210. Therefore, the control veins 210 could be moved from completely open to completely closed using 90 full rotations of the worm gear 230. While one specific embodiment has been given in the servo damper 200 of FIG. 2, as well as the operation thereof, those skilled in the art understand that other types of actuators and linkages, and their operation, could be used while remaining within the purview of this disclosure Returning to FIG. 1, the apparatus 100 includes one or more air sensors 170 associated with the one or more servo dampers 160. As briefly touched upon above, the air sensors 170 assist in the proper control of the one or more servo dampers 160 by measuring the velocity and/or temperature of the air passing through them. Those skilled in the art understand the types of air sensors 170 that might be used, including air sensors 170 measuring the velocity and temperature of the airflow exiting the one or more servo dampers 160. Those skilled in the art additionally understand the operation of such air sensors 170.

The apparatus 100 additionally includes one or more temperature sensors (e.g., $T_1$ thru $T_{16}$) 180 associated with the one or more slots. In the example embodiment of FIG. 1, the temperature sensors 180 are positioned proximate a junction between the one or more slots and the second plenum 140 (e.g., the exhaust plenum in this embodiment). Accordingly, the temperature sensors 180 of FIG. 1 are measuring the temperature of the airflow after passing over the one or more circuit boards 120 and before exiting the second plenum 140 into the surrounding environment. In an alternative embodiment, however, the temperature sensors 180 could be placed at any location on the circuit boards 120 themselves (e.g. as a stand alone device) or could even be built into the already existing circuitry on the circuit boards 120. In the embodiment wherein the temperature sensors 180 are built into the already existing circuitry, such temperature sensors 180 might be built into the higher wattage circuitry of each circuit board 120. Moreover, as indicated above, the temperature sensors 180 could be built within the air sensors 170.

The number of servo dampers used in a particular apparatus 100 may vary based upon the application. In one particular embodiment a single servo damper exists for each slot (see FIG. 3 below). In another embodiment, a single servo damper exists for each airflow path, including multiple airflow paths on a single circuit board 120 (see FIG. 4 below). Accordingly, in certain embodiments multiple servo dampers may exist for each slot, thereby providing a matrix of servo dampers.

Figure 3:
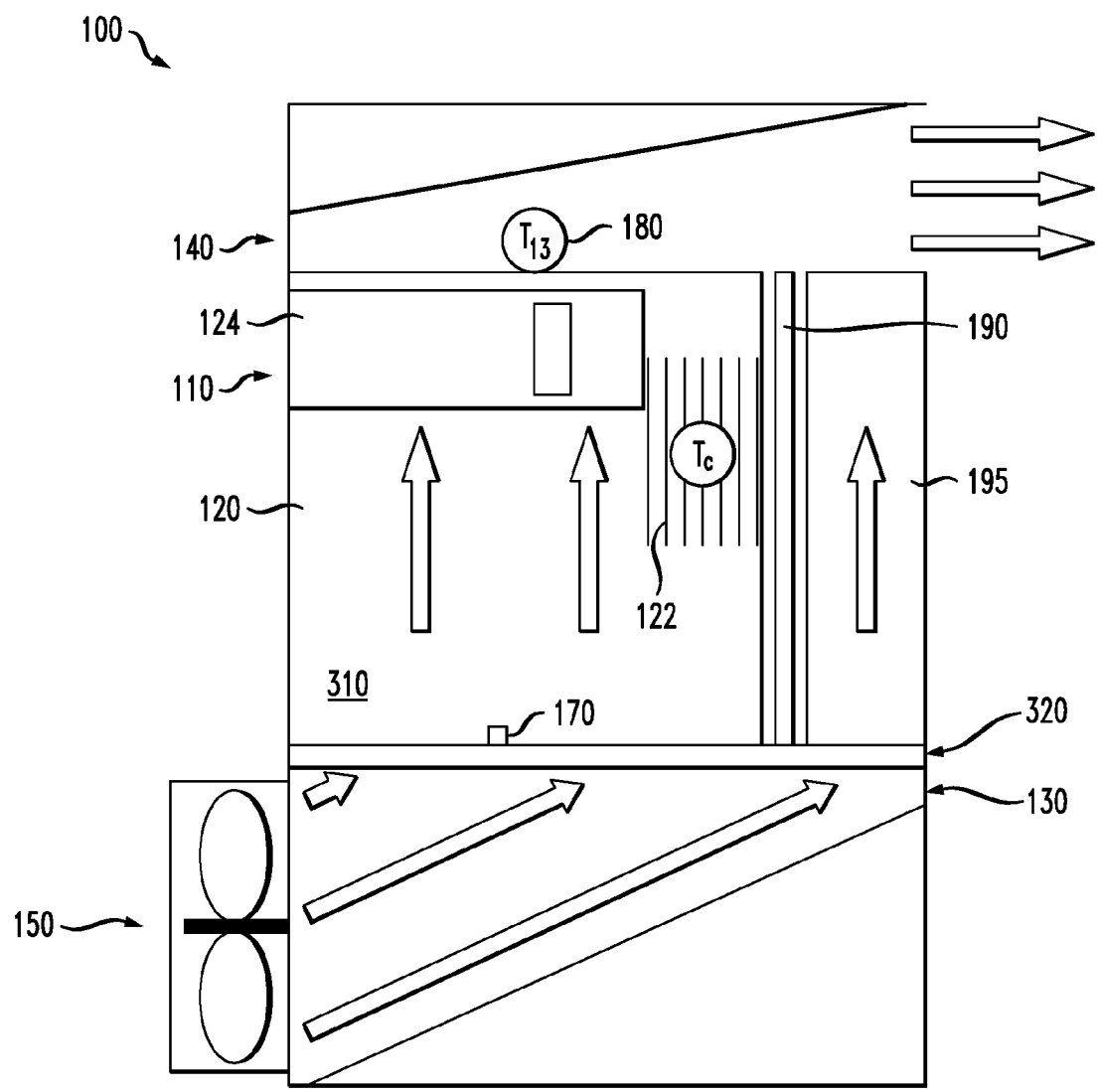
FIG. 3 illustrates a sectional view of one embodiment of the apparatus of FIG. 1.

FIG. 3 illustrates a sectional view of one embodiment of the apparatus 100, for example taken though the line 3-3. As is illustrated in FIG. 3, the circuit board 120 includes a plurality of components. For instance, the circuit board 120 of FIG. 3 includes a high power chip 122 with an associated heat sink, and a mezzanine module 124 (e.g., an AdvancedMC), among others (e.g., optical modules, disk drives, etc.). The high power chip 122, in this embodiment, additionally includes a built in temperature sensor $T_c$. The temperature sensor $T_c$ provides similar functionality as the previously discussed temperature sensor 180, which is located in the second plenum 140. Nevertheless, the temperature sensor $T_c$ is configured to measure the specific temperature of the high power chip 122, whereas the temperature sensor 180 is configured to measure the temperature of the airflow after is passes over the circuit board 120.

In the embodiment of FIG. 3, the circuit board 120 mates with a backplane 190. The backplane 190 may be similar to any backplane currently used in an electronics chassis, including a backplane designed and manufactured in accordance with the AdvancedTCA standard. The backplane 190, in one embodiment, is configured to provide power or instructions (e.g., control signals) to the servo damper 320. Additionally, the backplane 190 in the embodiment of FIG. 3 is coupled to a rear transition module (RTM) 195. The RTM 195 may also be similar to any RTM currently used in an electronics chassis, including an RTM designed and manufactured in accordance with the AdvancedTCA standard.

In the embodiment of FIG. 3, the circuit board 120, backplane 190 and RTM 195 form a single air path 310 controlled by the single servo damper 320. Accordingly, in this disclosed embodiment, a single air path exists for each slot in the chassis 110. Accordingly, the servo damper 320 of FIG. 3 may be opened and closed to adjust what portion of the airflow created by the fan assembly 150 is allocated to the air path 310. In those operational conditions wherein the max amount of airflow is desired for the air path 310, the servo damper 320 could be completely opened. However, in those operational conditions wherein the minimum amount of airflow is desired for the air path 310, for instance if the components of the circuit board 120 generate very little heat or the circuit board 120 has been removed, the servo damper 320 could be completely closed. Obviously, positions of the servo damper 320 between fully opened and fully closed will often be used.

Figure 4:
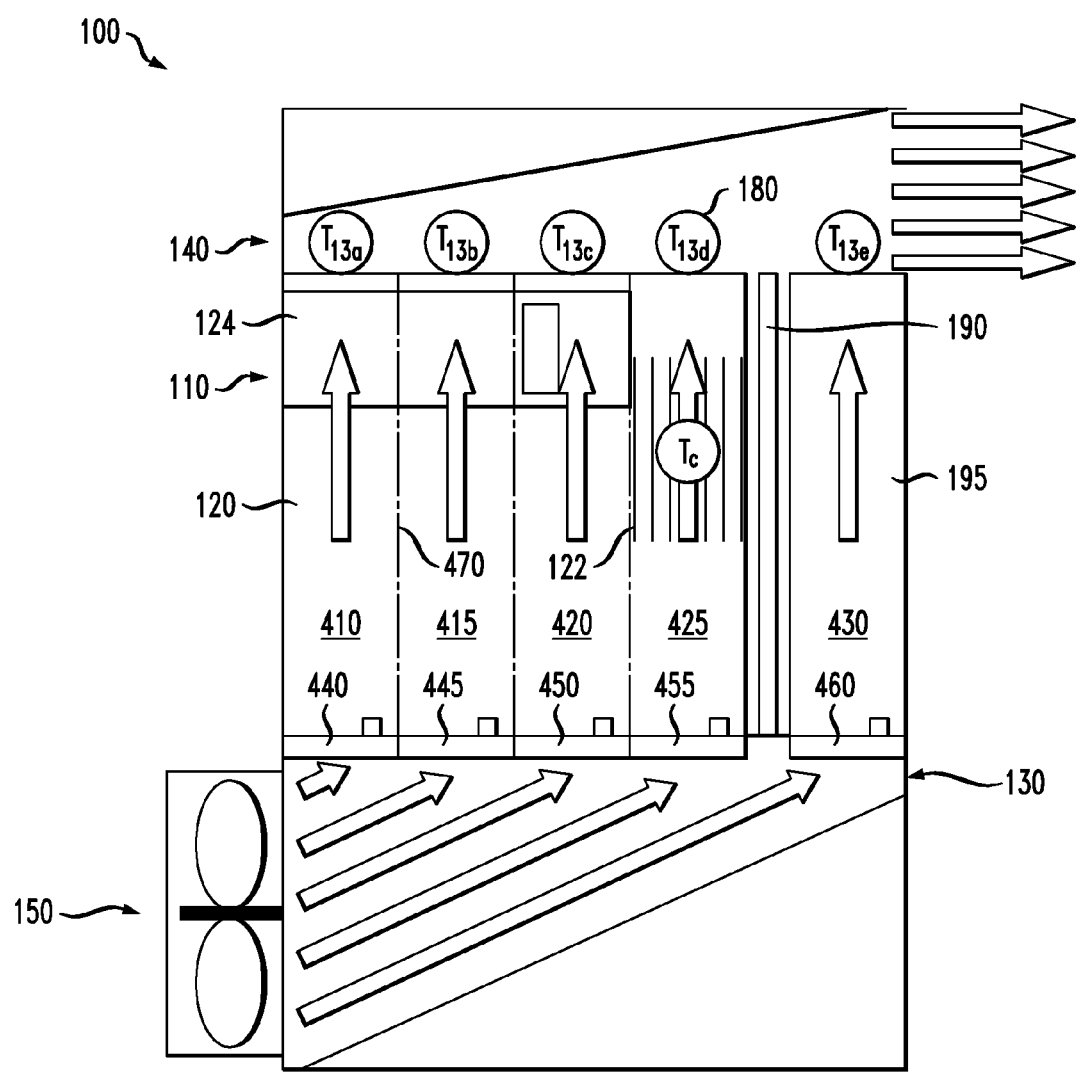
FIG. 4 illustrates a sectional view of another embodiment of the apparatus of FIG. 1.

FIG. 4 illustrates a sectional view of another embodiment of the apparatus 100 taken though the line 3-3. The embodiment of the apparatus 100 of FIG. 4 is similar in many ways to the embodiment of the apparatus 100 of FIG. 3. However, whereas the embodiment of FIG. 3 contains only a single air path 310 controlled by the single servo damper 320 for each slot, the embodiment of FIG. 4 contains a plurality of air paths controlled by a plurality of servo dampers for each slot. For example, in the embodiment of FIG. 4, air paths 410-430 are each independently controlled by associated servo dampers 440-460. For instance, air paths 410-425 are dedicated to the circuit board 120 itself, whereas the air path 430 is dedicated to the RTM 195. Accordingly, in this embodiment the overall airflow created by the fan assembly 150 may not only be independently allocated among the different slots (e.g., circuit boards 120), but in this embodiment may further be independently allocated among the various different air paths of each slot (e.g., circuit board). Moreover, each of the servo dampers 440-460 may receive feedback data from associated temperature sensors ($T_{l3a}$ thru $T_{13e}$).

The servo dampers 440-460, in one embodiment, can be mounted in one or more field replaceable trays. The field replaceable tray, in this embodiment, allows for the easy replacement of a single servo damper that is faulty for one reason or another (e.g., need maintenance, repair, etc.). In the embodiment of FIG. 4, the field replaceable tray is a separate unit as the fan assembly. Nevertheless, in certain embodiments the fan assembly and the field replaceable tray might be integrated with one another.

Those skilled in the art understand that certain physical changes may need to be made to create the multiple different air paths 410-430. For instance, physical dividers 470 may be used to create the multiple different air paths 410-430. The physical dividers 470 may, among other locations, be built onto the circuit board 120. In an alternative embodiment, however, the physical dividers 470 may be built into the slots in the chassis 110. Nevertheless, those skilled in the art understand the myriad of configurations that might be used to create the multiple different air paths 410-430.

The embodiments of FIGS. 3 and 4 (e.g., in conjunction with the embodiment of FIG. 1) are used to illustrate that the chassis 110 may include any number of slots (e.g., N slots) configured to hold any number of circuit boards (e.g., N circuit boards). The embodiments of FIGS. 3 and 4 further illustrate that each circuit board may include any number of different air paths (e.g., M different air paths per circuit board). Accordingly, the number of servo dampers used in any single application can be the product of the number of slots and the number of different air paths per circuit board. For instance, if N=16 and M=1, as illustrated by the embodiment of FIG. 3, the apparatus would generally have 16 servo dampers positioned to individually allocate the airflow to the 16 different air paths. However, if N=16 and M=5, as illustrated by the embodiment of FIG. 4, the apparatus would generally have 80 servo dampers positioned to individually allocate the airflow to the 80 different air paths. That being said, a single servo damper may be used to allocate the airflow to each slot, or a plurality of servo dampers may be used to allocate the airflow to each slot (e.g., a matrix of servo dampers).

An apparatus, such as the apparatus 100 of FIGS. 1, 3 and 4, may be operated in a number of different ways. For example, as indicated above, the control of the servo dampers may be either manual or automatic. Using the manual operation configuration, the customer might manually adjust the position of the servo dampers based upon specific feedback, for instance temperature feedback, air velocity feedback, etc, as well as physical changes to the system. This adjustment may be accomplished via remote control, typically using commands to a human machine interface on a computerized control subsystem that has a means to communicate with the servo dampers and air sensors.

Using the automatic operation configuration, the customer might choose one of a fully dynamic mode, semi-static mode or fully static mode. For instance, the fully dynamic mode would tend to change the position of the servo dampers regularly, as well as the airflow provided by the fan assembly, based upon the changing needs of the system. Such a fully dynamic mode might use a control algorithm to optimize the system thermal and operational parameters for the apparatus. In one embodiment, the control algorithm might do so by moving the servo dampers of the apparatus to a fully open position, for example using the position feedback data. The control algorithm would then gradually increase the airflow provided by the fan assembly until a last of the servo dampers moves from the fully open position to a slightly closed position, for example based upon temperature data. The control algorithm would then gradually decrease the airflow provided by the fan assembly until that last servo dampers moves back to the fully open position. It is believed that at this precise moment, the system would be substantially optimized.

In an alternative embodiment, the control algorithm might optimize the system by increasing the airflow provided by the fan assembly to a high value. This high value could either be a max airflow of the fan assembly, or a value known to be great enough to cool all the components of the system. Then, the control algorithm would gradually decrease the airflow provided by the fan assembly until a first of the servo dampers moves to a fully open position, for example based upon the temperature data. Again, it is believed that at this precise moment, the system would be substantially optimized.

A further embodiment of the control algorithm may initially drive all servo dampers to their half open position. Thereafter, based upon feedback from the air sensors, the control algorithm would open and close the servo dampers and increase or decrease the airflow of the fan assembly, as appropriate. This control method tries to maintain the average openness of the servo dampers at about 50 percent.

If the customer prefers to use the servo controlled damper mechanism in a static or semi-static mode rather than in the fully dynamic mode, software could provide the ability to set the flow balancing configuration according to a configuration file (depending upon the hardware configuration of the customer). This configuration file can be provided by the factory along with a fully defined hardware configuration, can be built during a learning phase, or can be saved at any time by the operator of the network for future reference or re-use. In one example embodiment, the configuration control files are pre-populated in anticipation of optimizing system performance under specific failure modes, for example the failure of a certain fan module.

The use of the servo dampers in accordance with this disclosure has many advantages. First, the inclusion of the servo dampers eliminates the tedious and error prone process of configuring the slot restrictions in a shelf to balance the airflows over each board with its cooling needs. Second, the servo dampers may be used to balance airflow restrictions while the system is running and without disrupting the configuration (whereas changing a restriction plate on a board, may require to physically extract the board which can cause service disruptions). Third, their use greatly improves the power consumption, acoustic emissions, and lifetime of the fan assembly, because the more efficient use of the airflow allows the fans to be run at lower speeds. For example, the acoustical emissions of the system may be kept below an acoustical emission specification of the system (e.g., OSHA specification) using the control subsystems. Fourth, the servo dampers allow the thermal and operational parameters to be optimized for the system. For instance, the optimal amount of cooling may be achieved for the least amount of energy, cost, etc. Accordingly, significant cost savings are achieved. Fifth, the use of the servo dampers allows for greater power budgets per board for AdvancedTCA systems. For instance, in certain embodiments power budgets of up to about 400 Watts per board, or even greater, may now be used without exceeding the thermal and/or acoustic limitations of the system. This is in direct contrast to existing systems, which might accommodate power budgets greater than 200-300 Watts, but that do so by exceeding at least one of the thermal and/or acoustic limitations of the system. Sixth, the servo dampers permit the system to better accommodate the cooling demands of abnormal situations, such as a fan failure, hot ambient temperature, or particularly heat sensitive components. Other advantages may also exist when using the servo dampers in accordance with this disclosure.

FIG. 5 illustrates a system 500 manufactured in accordance with the disclosure. The system 500 of FIG. 5 includes an installation site 510 and one or more control subsystems 550. The installation site 510, in one embodiment, includes a plurality of racks 520, each having two or more stacked apparatus 530. The term installation site 510, as used herein, refers to a location where one or more racks 520 might be positioned. Accordingly, the installation site 510 might comprise a stand alone building (e.g., a telecom or datacom site) positioned at a desired location, or alternatively might comprise a room within a larger building (e.g., a server room). Accordingly, the installation site 510 should not be limited to any specific structure or location.

The racks 520 of FIG. 5 may be similar to any rack used in an electronics assembly, including a rack designed and manufactured in accordance with the 19 inch or ETSI standard. In the embodiment of FIG. 5, each rack 520 is configured to hold three stacked apparatuses 530; nevertheless, other configurations exist wherein each rack 520 includes more or less than three stacked apparatuses 530.

The apparatuses 530 of FIG. 5 are designed in accordance with this disclosure. In one embodiment, the apparatuses 530 of FIG. 5 are each similar to the apparatus 100 of FIG. 1, 3 or 4. Accordingly, in this embodiment, each apparatus 530 would include a chassis having one or more slots configured to hold one or more circuit boards, a first and second plenum coupled to the chassis, a fan assembly coupled to the first plenum, and a plurality of servo dampers for allocating the airflow created by the fan assembly. Nevertheless, apparatuses different from those detailed in FIGS. 1, 3 and 4 could be used as the apparatus 530, and remain within the purview of the disclosure.

The installation site 510 of FIG. 5 further includes an air control structure 540. In the embodiment of FIG. 5, the air control structure 540 comprises an air conditioner configured to reduce the inside temperature of the installation site 510. In an alternative embodiment, the air control structure 540 comprises a fan configured to mix the warmer air within the installation site 510 and the cooler air surrounding the installation site 510. The air control structure 540 should not be limited to any specific type or design.

The system 500 of FIG. 5 further includes one or more control subsystems 550. The control subsystems 550 may include any subsystem capable of controlling the servo dampers of each of the apparatus 530. In one embodiment, an apparatus control subsystem 550 exists for each apparatus 530. In this embodiment, each apparatus control subsystem would be configured to control the servo dampers of an associated apparatus 530 to allocate a portion of the airflow of each fan assembly to each of the associated air paths. For example, each of the apparatuses 530 could be controlled by an associated apparatus control subsystem 550 in a manner similar to the control of the apparatus 100, as discussed above.

In an alternative embodiment, a rack control subsystem 550 exists for each rack 520 in the installation site 510. In this alternative embodiment, each rack control subsystem 550 would be configured to control the servo dampers within each associated rack 520, for example to allocate a portion of the airflow of each fan assembly to each of the associated air paths within the associated racks. In yet another alternative embodiment, an installation site control subsystem 550 exists for the entire installation site 510. In this example embodiment, a single installation site control subsystem 550 would be configured to control all of the servo dampers within the installation site 510, as well as the air control structure 540. It should additionally be noted that the use of any combination of apparatus control subsystems, rack control subsystems and installation site control subsystems is within the scope of the disclosure.

In the embodiment of FIG. 5, the control subsystem 550 includes a computer subsystem 565. The computer subsystem 565 may be in electrical communication with the stacked apparatuses 530 of the installation site 510, for example via cables 570 or via a wireless connection. The computer subsystem 565 may further be configured to receive information from the stacked apparatuses 530 of the installation site 510, process the received information, and transmit a command back to one or more servo dampers based upon the received and processed information. This feedback loop may be based upon readings from the temperature sensors in the stacked apparatuses 530, airflow sensors in the stacked apparatuses 530 or any combination thereof, among other items.

In one embodiment, the computer subsystem 565 may be software (e.g., including a control algorithm) residing on a conventional personal computer. The software embodiment includes source code, object code, libraries, executable programs and other software structures that cooperatively function together to achieve the functionality of the present disclosure. The computer subsystem 565 may also include a monitor 575, a cabinet 580 and a keyboard 585, among other devices. Alternatively, however, the monitor 575 and the keyboard 585 may be replaced by other conventional output and input devices, respectively.

In another embodiment, the computer subsystem 565 may be integrated directly into the rack 520 or apparatus 530. Shelf Management Controllers or Fan controllers are common computerized elements of systems like AdvancedTCA, and typically have the required interfaces and CPU power to perform the servo damper control algorithms. There is an autonomic feedback loop at the apparatus level, whereby each apparatus 530 adjusts its own servo dampers and fan assembly based upon the condition of its sensors. This feedback loop allows each apparatus 530 to regulate its cooling system autonomously, for example using the apparatus control subsystem discussed above.

There can also be a feedback loop at the level of the rack 520. Rack level temperature and airflow sensors communicate with the airflow control algorithms in each apparatus 530 installed in the rack 520, balancing the cooling capacity at the rack level. This embodiment may be accommodated using the rack control subsystem discussed above. Another nested feedback loop is at the level of the installation site 510. Control subsystem 550 manages the overall cooling at the facility level, through its interaction with the apparatus 530 and rack 520 level loops. This level is where human interaction via the computer subsystem 565 is quite valuable. Again, this embodiment might be accommodates using the installation site control subsystem discussed above.

It should be noted that any conventional computer system having at least one CPU that is suitable to function as the computer subsystem 565, including without limitation, handheld units, laptop/notebooks, minis, mainframes and supercomputers, including RISC and parallel processing architectures, as well as combinations of such systems, may be used. Alternative computer system embodiments may be firm-or hardware-based. It should also be noted that the computer subsystem 550 need not be located at a location different from the installation site 510. Accordingly, in one embodiment the computer subsystem 550 is located within the installation site 510, for example within a rack 520 or apparatus 530. In this embodiment the computer subsystem may be controlled from either within the installation site or from an external location.

Although the present disclosure has been described in detail, those skilled in the art should understand that they can make various changes, substitutions and alterations herein without departing from the spirit and scope of the disclosure in its broadest form.

What is claimed is:

1. An apparatus, comprising:
   a chassis having N slots configured to hold N circuit boards, each circuit board having M different air paths;
   a plenum coupled to the chassis;
   a fan assembly coupled to the plenum and configured to provide an airflow therethrough; and
   a product of N by M servo dampers associated with the N slots, wherein ones of the N by M servo dampers are positioned to individually allocate the airflow to the different air paths.

2. The apparatus of claim 1 wherein N is equal to one and M is greater than one.

3. The apparatus of claim 1 wherein N is greater than one and M is equal to one, thereby providing one servo damper per circuit board.

4. The apparatus of claim 1 wherein both N and M are greater than one, thereby forming a matrix of servo dampers.

5. The apparatus of claim 1 wherein one or more air sensors are associated with each of the slots.

6. The apparatus of claim 1 wherein each servo damper includes one or more vanes configured to rotate based upon an instruction from a control subsystem.

7. The apparatus of claim 1 wherein each servo damper includes a position feedback feature associated therewith and configured to provide position feedback to a control subsystem.

8. The apparatus of claim 1 wherein the plenum is an intake plenum, and further including an exhaust plenum located on an opposing side of the chassis, the servo dampers being located proximate the intake plenum.

9. The apparatus of claim 1 wherein the servo dampers are located on one or more servo damper trays that can be extracted for maintenance or repair.

10. A method for operating a system, comprising:
    providing an apparatus, wherein the apparatus includes:
        a chassis having N slots configured to hold N circuit boards, each circuit board having M different air paths;
        a plenum coupled to the chassis;
        a fan assembly coupled to the plenum; and
        a product of N by M servo dampers associated with the N slots, wherein ones of the N by M servo dampers are positioned to individually allocate the airflow to the different air paths;
    activating the fan assembly to provide an airflow into the plenum; and
    adjusting positions of one or more of the product of N by M servo dampers to allocate the airflow among air paths associated with the N slots, wherein the adjusting is based upon at least one of temperature data or airflow data obtained from the apparatus.

11. The method of claim 10, wherein adjusting includes adjusting the positions to provide substantially only the required amount of airflow to each of the air paths.

12. The method of claim 11, further including increasing or decreasing the airflow of the fan assembly based upon the positions.

\* \* \* \* \*